United States Patent
Karls et al.

(10) Patent No.: US 8,543,904 B1
(45) Date of Patent: Sep. 24, 2013

(54) MULTI-COLUMN SEARCH RESULTS INTERFACE HAVING A WHITEBOARD FEATURE

(75) Inventors: Jason Karls, Burlingame, CA (US);
Ruben E. Ortega, Seattle, WA (US);
Udi Manber, Palo Alto, CA (US)

(73) Assignee: A9.com, Inc., Palo Alto, CA (US)

( * ) Notice: Subject to any disclaimer, the term of this patent is extended or adjusted under 35 U.S.C. 154(b) by 249 days.

(21) Appl. No.: 12/958,902

(22) Filed: Dec. 2, 2010

Related U.S. Application Data

(62) Division of application No. 10/934,922, filed on Sep. 2, 2004, now Pat. No. 7,873,622.

(51) Int. Cl.
*G06F 17/30* (2006.01)

(52) U.S. Cl.
USPC ........... 715/221; 707/704; 707/705; 707/707; 707/715

(58) Field of Classification Search
CPC ............................. G06F 17/30; G06F 17/00
See application file for complete search history.

(56) References Cited

U.S. PATENT DOCUMENTS

| | | | | |
|---|---|---|---|---|
| 3,647,961 A * | 3/1972 | Blitchington et al. | ......... | 348/125 |
| 3,665,396 A * | 5/1972 | Forney, Jr. | ..................... | 714/789 |
| 3,823,365 A * | 7/1974 | Anderson | ..................... | 324/328 |
| 3,916,699 A * | 11/1975 | Moran et al. | ..................... | 73/623 |
| 4,064,742 A * | 12/1977 | Pittaro | ............................ | 73/611 |
| 4,102,205 A * | 7/1978 | Pies et al. | ........................ | 73/626 |
| 4,135,058 A * | 1/1979 | Pfost et al. | ...................... | 379/79 |
| 4,220,084 A * | 9/1980 | Maclean et al. | ............... | 101/235 |
| 4,224,665 A * | 9/1980 | de Bijl et al. | ...................... | 710/5 |
| 4,495,636 A * | 1/1985 | Jacobs et al. | ..................... | 378/87 |
| 4,530,085 A * | 7/1985 | Hamada et al. | ............... | 370/224 |
| 4,547,854 A * | 10/1985 | Hashimoto et al. | ........... | 700/183 |
| 4,586,441 A * | 5/1986 | Zekich | ............................... | 109/8 |
| 4,587,878 A * | 5/1986 | Nakada et al. | ................... | 84/613 |
| 4,601,490 A * | 7/1986 | Brandon | ........................... | 283/56 |
| 4,616,264 A * | 10/1986 | Pshtissky | ........................ | 348/351 |
| 4,658,241 A * | 4/1987 | Torre | ............................. | 340/551 |
| 4,703,275 A * | 10/1987 | Holland | ........................ | 324/318 |
| 4,737,923 A * | 4/1988 | Matsuzaki et al. | ........... | 358/1.12 |
| 4,781,263 A * | 11/1988 | Eto et al. | ........................ | 180/423 |
| 4,788,538 A * | 11/1988 | Klein et al. | ..................... | 345/418 |
| 4,812,713 A * | 3/1989 | Blanchard | ..................... | 315/370 |
| 4,847,603 A * | 7/1989 | Blanchard | ......................... | 345/7 |
| 4,862,390 A * | 8/1989 | Weiner | ......................... | 715/822 |
| 4,864,241 A * | 9/1989 | Goldie | ........................... | 324/318 |
| 5,838,317 A | 11/1998 | Bolnick et al. | | |

(Continued)

OTHER PUBLICATIONS

A9, © 2003-2006 A9.com, Inc., <http://www.A9.com/> [retrieved Feb. 7, 2006], 2 pages.

(Continued)

*Primary Examiner* — Farhan Syed
(74) *Attorney, Agent, or Firm* — Novak Druce Connolly Bove + Quigg LLP

(57) ABSTRACT

Graphical user interfaces that are well suited for displaying search results from multiple search categories are described. In one aspect of the invention, a graphical user interface is provided that includes a window having at least two panes that are arranged to display search results from searches in different search categories. Each pane can be presented in an open state suitable for displaying information and a closed state. A user may adjust the relative sizes of the panes and the user may switch the panes between the open and closed states.

26 Claims, 12 Drawing Sheets

(56) References Cited

U.S. PATENT DOCUMENTS

| | | | |
|---|---|---|---|
| 5,913,215 A | 6/1999 | Rubinstein et al. | |
| 6,014,662 A | 1/2000 | Moran et al. | |
| 6,025,844 A * | 2/2000 | Parsons | 715/805 |
| 6,104,401 A * | 8/2000 | Parsons | 715/804 |
| 6,282,548 B1 | 8/2001 | Burner et al. | |
| 6,366,910 B1 | 4/2002 | Rajaraman et al. | |
| 6,463,460 B1 * | 10/2002 | Simonoff | 709/203 |
| 6,466,918 B1 | 10/2002 | Spiegel et al. | |
| 6,636,853 B1 | 10/2003 | Stephens, Jr. | |
| 6,920,459 B2 | 7/2005 | Dedhia et al. | |
| 7,031,961 B2 | 4/2006 | Pitkow et al. | |
| 7,082,576 B2 | 7/2006 | Shahine et al. | |
| 7,149,982 B1 | 12/2006 | Duperrouzel et al. | |
| 7,383,513 B2 * | 6/2008 | Goldberg et al. | 715/763 |
| 7,484,185 B2 * | 1/2009 | Farrington et al. | 715/860 |
| 7,519,595 B2 | 4/2009 | Solaro et al. | |
| 7,664,770 B2 * | 2/2010 | Jackson et al. | 707/706 |
| 7,788,582 B2 * | 8/2010 | Robbin et al. | 715/716 |
| 7,831,579 B2 * | 11/2010 | Wade et al. | 707/705 |
| 7,873,622 B1 * | 1/2011 | Karls et al. | 707/707 |
| 8,090,719 B2 * | 1/2012 | Wade et al. | 707/736 |
| 8,140,564 B2 * | 3/2012 | Esser | 707/769 |
| 8,200,676 B2 * | 6/2012 | Frank | 707/749 |
| 2002/0091762 A1 | 7/2002 | Sohn et al. | |
| 2002/0099685 A1 | 7/2002 | Takano et al. | |
| 2002/0198882 A1 | 12/2002 | Linden et al. | |
| 2003/0088545 A1 | 5/2003 | Subramaniam et al. | |
| 2003/0187968 A1 | 10/2003 | McKnight | |
| 2003/0214538 A1 * | 11/2003 | Farrington et al. | 345/854 |
| 2003/0234772 A1 | 12/2003 | Zhang et al. | |
| 2004/0054968 A1 | 3/2004 | Savage | |
| 2004/0070627 A1 | 4/2004 | Shahine et al. | |
| 2005/0004911 A1 * | 1/2005 | Goldberg et al. | 707/7 |
| 2005/0033803 A1 | 2/2005 | Vleet et al. | |
| 2005/0076019 A1 * | 4/2005 | Jackson et al. | 707/3 |
| 2005/0222987 A1 | 10/2005 | Vadon | |
| 2005/0289394 A1 | 12/2005 | Arrouye et al. | |
| 2006/0004717 A1 | 1/2006 | Ramarathnam | |
| 2006/0053382 A1 * | 3/2006 | Gardner et al. | 715/764 |
| 2007/0011150 A1 * | 1/2007 | Frank | 707/4 |
| 2007/0050344 A1 * | 3/2007 | Rind et al. | 707/3 |
| 2007/0073713 A1 * | 3/2007 | Thomas | 707/10 |
| 2008/0270366 A1 * | 10/2008 | Frank | 707/3 |
| 2009/0171920 A1 * | 7/2009 | Wade et al. | 707/4 |
| 2010/0153414 A1 * | 6/2010 | Esser | 707/758 |
| 2010/0192066 A1 * | 7/2010 | Wu | 715/727 |
| 2011/0010661 A1 * | 1/2011 | Wade et al. | 715/803 |
| 2011/0145753 A1 * | 6/2011 | Prakash | 715/783 |

OTHER PUBLICATIONS

Alexa, © 1996-2004 Alexa Internet, Inc. <http://www.alexa.org/> [retrieved Feb. 7, 2006], 4 pages.

AltaVista, © 2006 Overture Services, Inc., <http://www.altavista.com/> [retrieved Feb. 7, 2006], 1 page.

Google, © 2006 Google, <http://www.google.com/> [retrieved Feb. 7, 2006], 1 page.

Kandogan, E. et al., "Elastic Windows: A Hierarchical Multi-Window World-Wide Web Browser," *Proceedings of the 10th Annual ACM Symposium on User interface Software and Technology*, Oct. 1997, ACM Press New York, NY, USA, pp. 169-177.

Nadamoto, A. et al., "A Comparative Web Browser (CWB) for Browsing and Comparing Web Pages," *Proceedings of the 12th International Conference on World Wide Web*, 2003, ACM Press New York, NY, USA, pp. 727-735.

Yahoo!, © 2006 Yahoo! Inc., <http://www.yahoo.com/> [retrieved Feb. 7, 2006], 2 pages.

* cited by examiner

| Home | Toolbar | Sign out |

Hello John, click here if this isn't you.

Search: [                    ] [Go]

Search History Recent Searches:
- insects
- insects (2)
- sectional couches
- pictures of arizona
- arizona (2)
- aquarium swings (2)
- southwest airline reservations Searches within:
- 📁 24 Hours (1)
- 📁 48 Hours (2)
- 📁 7 Days (1)
- 📁 14 Days (9)
- 📁 May 2004 (13)

Edit

EditAbout Feedback About Us | What's Cool | Jobs | Feedback

*FIG. 1*

Hello John, click here if this isn't you.

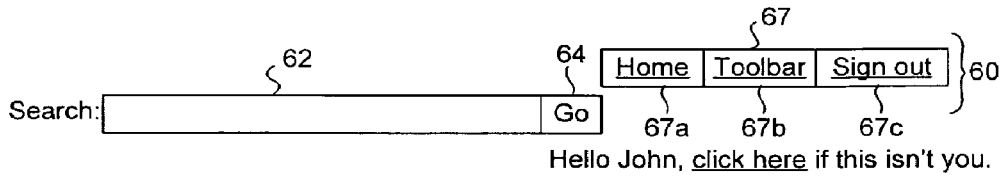

Hello John, click here if this isn't you.

| Book Results [close] | Showing 1-10 of 41,987 |

Garden Insects of North America : The Ultimate Guide to Backyard Bugs (Princeton Field Guides)
by Whitney Cranshaw (08 March, 2004)

For Love of Insects
by Thomas Eisner (30 November, 2003)

National Audubon Society Field Guide to North American Insects and Spiders (Audubon Society Field Guide)
by Lorus Milne and Lorus J. Milne (01 November, 1980)

Insects: A Guide to Familiar American Insects (Golden Guide)
by Herbert Spencer Zim, Clarence Cottam, Jonathan P. Latimer, David Wagner, James Gordon Irving, Susan Simon, and Herbert S. Zim (01 February, 2001)

page 2 : " ... four life stages. CADDISFLIES (Trichoptera), page 83. Small to medium-sized insects. Most larvae live in fresh water. Some build ornamented cases. ... " See more references to insects in this book.
A Field Guide to Insects
by Richard E. White, Donald J. Borror, and Roger Tory Peterson (15 April, 1998)

The Organic Gardener's Handbook of Natural Insect and Disease Control: A Complete Problem-Solving Guide to Keeping Your Garden & Yard Healthy Without Chemicals
by Barbara W. Ellis and Fern Marshall Bradley (15 May, 1996)

page 3 : " ... balances that prevents devastating outbreaks of pests or diseases. Some insects in a woodland or meadow eat plants, but natural predators ... " See more references to insects in this book.
Photographic Atlas of Entomology and Guide To Insect Identification
by James L. Castner (15 December, 2000)

Simon and Schuster's Guide to Insects (Fireside Book)
by Ross H. Arnett and Richard L. Jacques (01 April, 1981)

76 ~ 1 2 3 4 5 6 7 8 9 10 Next >>

Search [insects] [Go] 61

About Us | What's Cool | Jobs | Feedback

FIG. 3D

| Home | Toolbar | Sign out |

Search: [_____] Go

Hello John, click here if this isn't you.

| Web Results [close] Showing 1-10 of 1,143,278 | Image Results [close] Showing 1-10 of 41,987 | Search History [close] |
|---|---|---|
| Insects<br>Sponsored Links:<br>Rid your Home of Pests and Termites Free Pest Evaluation from Terminix<br>www.Terminix.com<br><br>Learn About Bugs<br>Insect glasses, the bug jug, books, ant farms, butterflies and more.<br>www.sciencekit.com<br><br>The Insects Home Page The Wonderful World of Insects, introducing the insect in all its amazing variety, with links to the many more detailed pages that make up this site. ...<br>http://www.earthlife.net/insects/six.html - 22k Cached (site info)<br><br>Insects on WWW<br><br>http://www.isis.vt.edu/~fanjun/text/Links.html - 1k Cached (site info) | Insects: Insects of all types.<br>www.insects.com/images.html<br><br>Images of Insects: Images of insects and their families....<br>http://www.insectimages.com/familylife.html<br><br>Insects and Spiders: Images of spiders eating insects....<br>http://spiders.com/foodchain.html<br><br>Snakes, Insects and Spiders: Images of snakes, insects and spiders....<br>http://www.wildlifeimages.com/snakes_insects_spiders.html<br>78a | Recent Searches:<br>• swings (2)<br>• arizona<br>• images of arizona (3)<br>• sectional sofa<br>78c<br>Searches within:<br>☐ 24 Hours (3)<br>☐ 14 Days (10)<br>Edit<br>About Feedback<br><br><br><br>78d |
| About Feedback | About Feedback | |

1 2 3 4 5 6 7 8 9 10 Next >>

Search [insects_____] Go

About Us | What's Cool | Jobs | Feedback

MULTI-COLUMN SEARCH RESULTS INTERFACE HAVING A WHITEBOARD FEATURE

CROSS-REFERENCES TO RELATED APPLICATIONS

This application is a divisional of U.S. patent application Ser. No. 10/934,822 filed on Sep. 2, 2004 of which the full disclosure of this application is incorporated herein by reference for all purposes.

BACKGROUND OF THE INVENTION

The present invention relates generally to graphical user interfaces adapted to present computer search results and/or search related information. More particularly, the user interface is arranged to present computerized search results from different search categories in separate panes of a graphical user interface window.

There are currently a wide variety of search engines and searching tools that permit computer users to search for electronic information. Some search engines, such as Google, Altavista, A9, and Yahoo allow users to search general web content. These and other search engines allow users to search narrower and/or other categories of information as well. For example, Google permits users to search such categories as images, news, and various products for sale. Google also allows users to search a variety of categories of the web content organized by topic (e.g., art, business, computers, science, shopping, sports, etc) or various subcategories of content (e.g. on-line mail order catalogs). Many web sites include features that allow users to search for terms used in their web site content and others allow users to search additional databases (such as a database of text from books, music etc.).

Although the existing search engines, searching tools and search interfaces work well, there are continuing efforts to improve the relevance, layout, presentation and usability of various search results.

SUMMARY OF THE INVENTION

To achieve the foregoing and other objects of the invention, graphical user interfaces that are well suited for displaying search results from multiple search categories are described. In one aspect of the invention, a graphical user interface is provided that includes a window having at least two panes that are arranged to display search results from searches in different search categories. Each pane can be presented in an open state suitable for displaying information and a closed state. A user may adjust the relative sizes of the panes and the user may switch the panes between the open and closed states.

In some implementations, three or more panes may be presented side-by-side as adjacent columns in certain search results states.

In some embodiments, adjustable column delimiters are provided between at least some of the panes to visibly mark the boundaries between adjacent panes. In such embodiments, the relative sizes (e.g. widths) of the panes may be adjusted by dragging the column delimiters.

In various embodiments, tabs or other GUI widgets may be used to mark associated closed panes. In such arrangements, a closed pane may be opened by selecting its associated tab or widget. In various embodiments, panes may be closed by selecting a close button displayed within the pane and/or moving an associated one of the column delimiter to a position where the column width is below a designated threshold.

In some of the described embodiments, different panes are arranged to display items such as general web search results, web image search results, book search results, music search results, news search results, map search results, address based search results, local area search results, dictionary search results, reference search results, diary search results, tracking number search results, bookmark search results, and search history search results.

In another aspect of the invention, a graphical user interface is provided that includes a first pane arranged to display search results and a second pane that is arranged as a whiteboard pane. In this aspect, the graphical user interface is configured such that a user may add information items to the whiteboard pane by moving information items displayed in other panes into the whiteboard pane. In some embodiments, the whiteboard pane includes a whiteboard section and a whiteboard search results section. The whiteboard section is arranged to display the information items. The whiteboard search results section is designed to present the results of a search of the contents of the whiteboard pane.

In yet another aspect of the invention, a graphical user interface is provided that includes a first pane arranged to display search results and a second pane that is arranged to display search history information indicative of previous searches that have been conducted by the user. The search history information includes at least one previous search entry. Each previous search entry indicates the search terms used in an associated previous search. Each search entry is also configured to contain a link that permits a user rerun, update or redisplay the previously executed search.

BRIEF DESCRIPTION OF THE DRAWINGS

The invention, together with further objects and advantages thereof, may best be understood by reference to the following description taken in conjunction with the accompanying drawings in which:

FIG. 1 is a screen shot illustrating a representative graphical user interface for receiving an initial search request;

FIG. 3(d) is a screen shot illustrating the representative graphical user interface shown in FIG. 2 with both the web results and the search history panes closed;

FIG. 6 is a screen shot illustrating a graphical user interface in accordance with a third embodiment of the invention;

FIG. 9 is a screen shot illustrating an alternative embodiment of a graphical user interface suitable for receiving an initial search request;

It is to be understood that, in the drawings, like reference numerals designate like structural elements. Also, it is understood that the depictions in the figures are diagrammatic and not to scale.

DETAILED DESCRIPTION OF THE INVENTION

Figure 2:
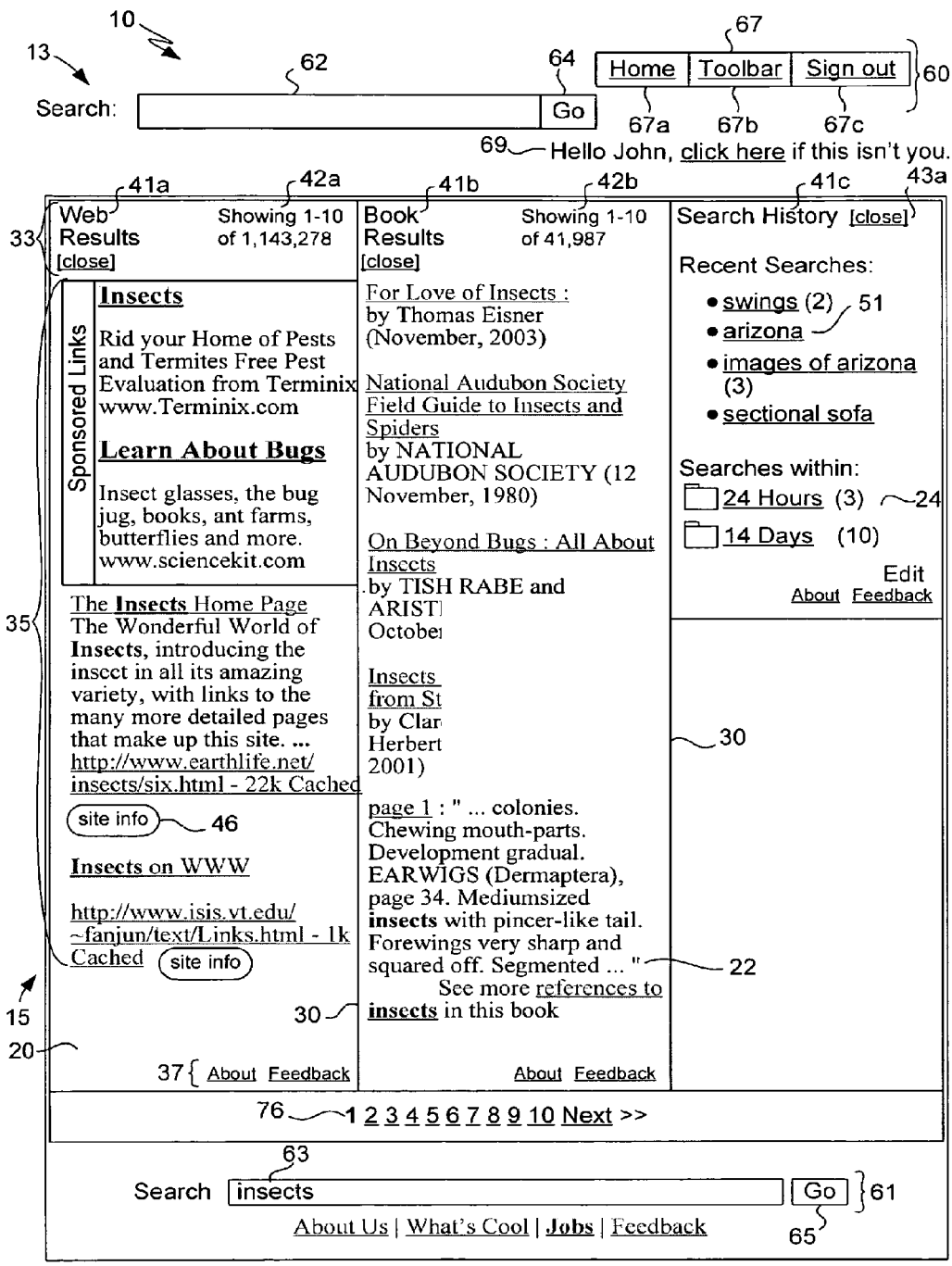
FIG. 2 is a screen shot illustrating a representative graphical user interface for rendering search results in accordance with one embodiment of the invention.

The present invention relates generally to graphical user interfaces suitable for displaying search results. Referring initially to FIG. 2, a representative graphical user interface in accordance with one embodiment of the present invention will be described. The graphical user interface 10 is represented as a browser window 13 that includes a search results window 15 having a plurality of separate panes. In the illustrated embodiment three panes 20, 22 and 24 are provided that are visually divided into three adjacent columns. The panes are arranged to display different types of search results and/or search related information. Adjacent panes are separated by column markers 30. As will be explained in more detail below, the column markers 30 are arranged so that the relative widths of the columns may be adjusted by dragging the column markers back and forth.

Each pane includes a header region 33, a body region 35 and a footer region 37. In the illustrated embodiment, each of the headers includes a title field 41 and a close button 43. The title field displays a simple title that identifies the type of search results or search related information. For example, the title in title field 41(a) for pane 20 reads "Web Results" which indicates that the contents displayed in the body of pane 20 are the search results from a general web search. By way of example, the web search results may be the results of a general web search provided by the Google search engine or any similar general web based search engine. Title field 41(b) reads "Book Results" which indicates that the contents displayed in the body of pane 22 are the search results from a search of the contents of books. In the illustrated embodiment, the book search results are the results of a book text database provided by Amazon.com, although of course, the search could be of any suitable database. Title field 41(c) reads "Search History" which indicates that the contents displayed in the body of pane 24 is information indicative of searches that were previously conducted by the current user. It should be appreciated that the searches in the different categories may be conducted by the same search service or by different search services.

Figure 3A:
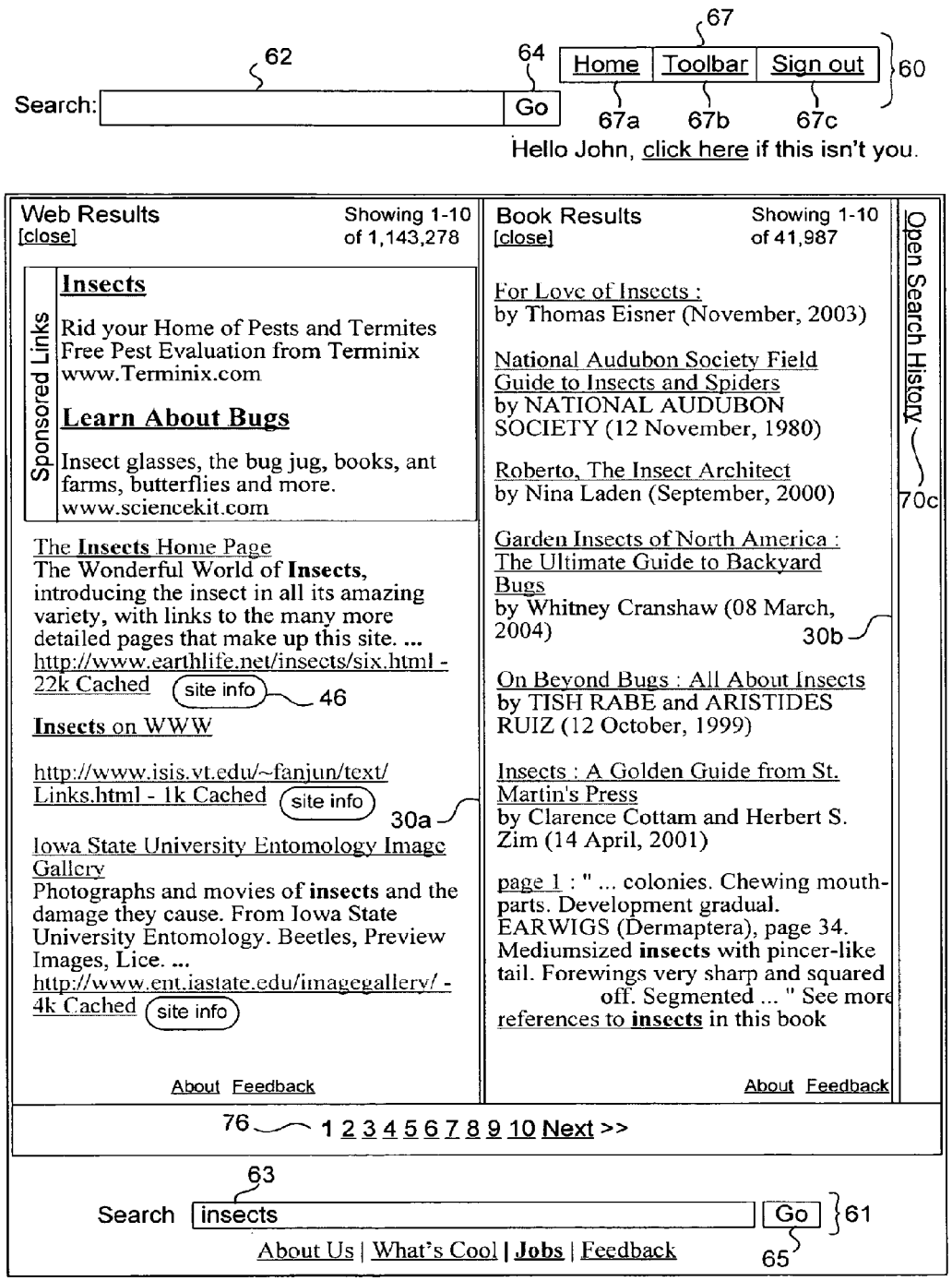
FIG. 3(a) is a screen shot illustrating the representative graphical user interface shown in FIG. 2 with the search history pane closed.
Figure 3B:
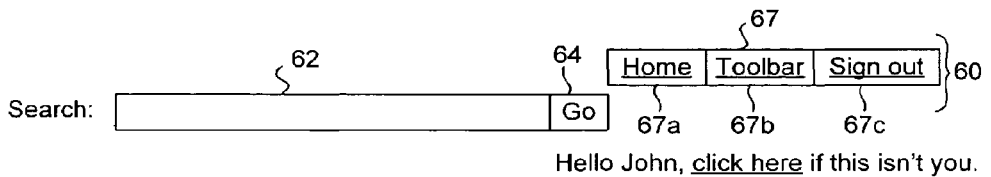
FIG. 3(b) is a screen shot illustrating the representative graphical user interface shown in FIG. 3(a) with both the search history and the book results panes closed.

The header regions also each have a "close" button or link 43, which will close the associated pane when selected. By way of example, if the close button 43(c) is selected in the environment illustrated in FIG. 2, it would cause the window 15 to refresh with the pane 24 closed as illustrated in FIG. 3(a). If the close button 43(b) associated with pane 22 is thereafter selected, it would also close the pane 22 and refresh window 15 with both panes 22 and 24 closed as illustrated in FIG. 3(b).

The headers 33 may also include other information that is believed to be useful to the user. By way of example, the headers 33(a) and 33(b) associated with the search results columns 20, 22 may include an indication 42(a), 42(b) of the number of search results found together with an indication of the results currently being shown in the associated pane.

The search results may be presented in any manner or form that is desired or deemed suitable by the search provider. In the illustrated embodiment, the body region 35 of the search result panes (columns) 20, 22 include a results list. Each entry in the web search results displayed in column 20 contains a link to the associated web page and typically includes a very short excerpt from the associated page (or page metadata). If a user selects a web results listing link, the browser is directed to retrieve and display the associated web page using standard browsing techniques. In a different embodiment (not illustrated) the body region 35 of one of the search result panes (columns) 20, 22 includes a scaled down or "preview" version of the web pages that are associated with the web search results. The preview version of the web pages can be displayed in the same frame as the links, similar to how the short excerpts from the associated pages are displayed in the embodiment illustrated in FIG. 2. Alternatively, the preview versions of the web pages can be displayed in a pane that is adjacent to the search result pane 20, 22, for example, as a result of a user moving his computer mouse across a web results listing link. In one embodiment, the user can select the displayed preview version of a web page and thereby cause the browser to be directed to retrieve and display the actual web page using standard browsing techniques.

Each entry in the web search results may also include other information believed to be of interest to the user. For example, some of the illustrated listings include a "site info" button 46 that contains a link that provides information about the referenced website. In one implementation, the site info button causes a web-site information search to be performed on the associated web site using a service such as the web-site information service provided by Alexa.com.

When desired, the results within a column may be divided into sponsored results and unsponsored results as illustrated in column 20. Typically, sponsored results are listings that an entity paid to have presented in response to the use of certain search terms. Of course the ordering of the search results, the presence or absence of sponsored search results and the general content of each listed entry may be widely varied.

In the illustrated embodiment, each listing in the book search results displayed in column 22 includes an indication of the book title, author, publication date, and potentially a very brief excerpt from the book. The book titles may contain an embedded link to a commercial bookseller's web page that is associated with the book (e.g. a page from which a user may purchase the book). If the user selects a book link, the browser is directed to retrieve and display the selected book related page.

The body section 35(c) of the search history pane 24 contains a listing of the user's recent search history. The manner of presenting the search history may be widely varied. Some ways of gathering and presenting search history information are described in U.S. patent application Ser. No. 10/612,395, filed on Jul. 2, 2003, and entitled "Server Architecture and Methods for Persistently Storing and Serving Event Data," which is hereby incorporated herein by reference for all purposes. In the embodiment illustrated in FIG. 2, the search history information is presented in terms of a listing of a few of the most recent searches that were conducted followed by the presentation of a set of folders that contain listings of the searches that were conducted by the user in specific time periods. By way of example, the illustrated embodiment lists the four most recently executed searches and an indication of how many times those searches were run if they were recently run multiple times. Each of the search history entries 51 is arranged as a link. Selection of a recent search history entry 51 causes that search to be reexecuted or updated or if the search results have been cached (or otherwise stored), they may simply be redisplayed. The reexecuted (or redisplayed)

search results would then be presented using the multi-paned search results window 15 described herein.

Figure 5:
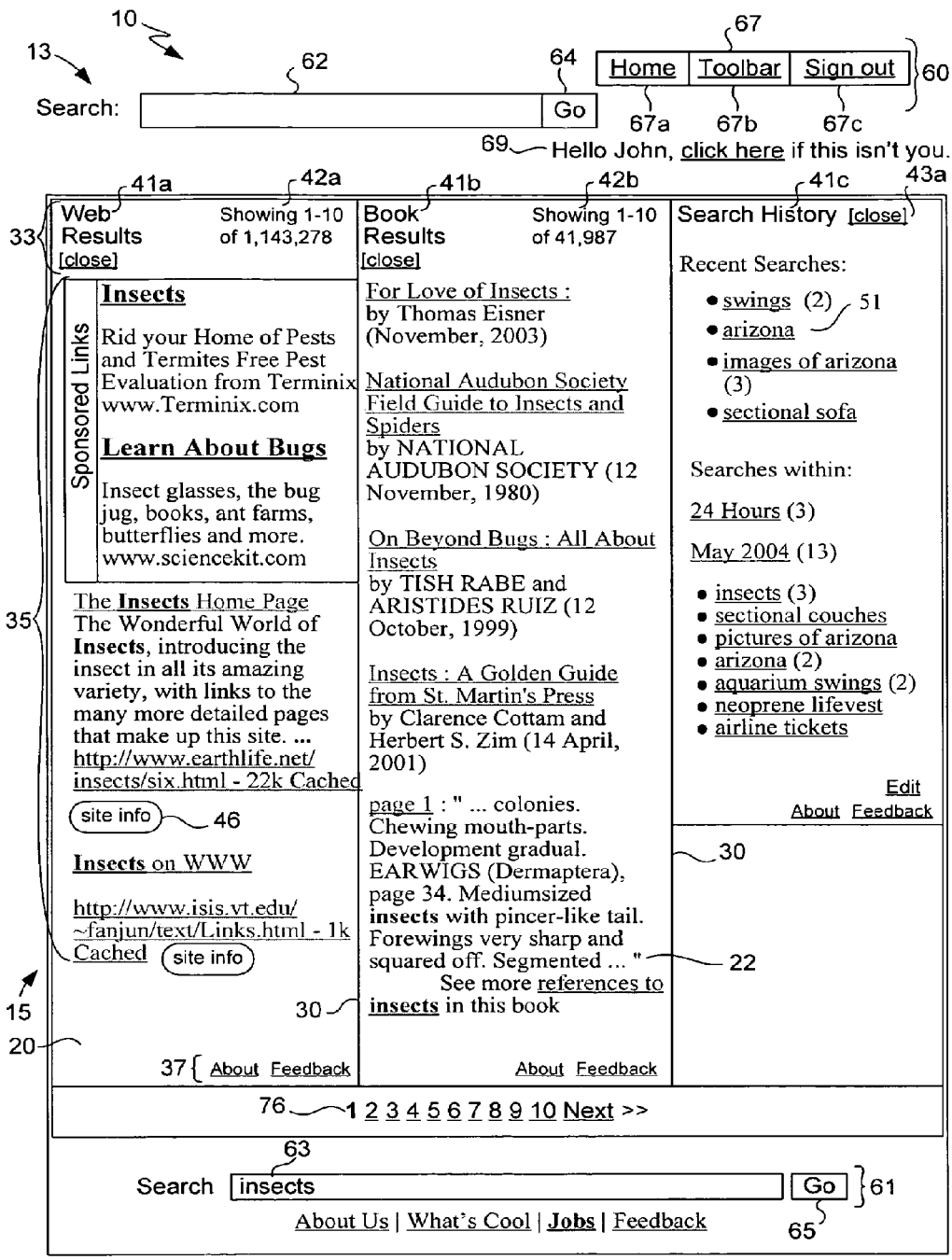
FIG. 5 is a screen shot illustrating the representative graphical user interface shown in FIG. 2 after selection of one of the search history folders.

The search history folders 53 are also arranged as links. Each folder has an associated time period such as the last 24 hours, the last week, the last 14 days, the last month etc. These folders each contain a list of search history entries corresponding to the searches that were conducted in the corresponding time period. Selection of a search history folder causes a list of search history entries corresponding to searches that were performed during the corresponding time period to be displayed within pane 24, while maintaining the contents of the other displayed panes (e.g., 20 and 22). This refreshing is generally illustrated by comparing FIG. 5 to FIG. 2. FIG. 5 generally illustrates the content of the browser window of FIG. 2 after the May 2004 search history folder has been selected. Again, selection of a particular search history entry will cause that search to be reexecuted (or updated or redisplayed) causing the contents of the entire multi-paned search results window 15 to be updated to display the new search results (as well as an updated search history).

In addition to the multi-paned search results window 15, the graphical user interface associated with web page 13 may also include some page header information 60 and some page footer information 61. In the illustrated embodiment, both the page header and the page footer include a search dialog box 62, 63, which permits users to enter search terms for a new search and a "go" button 64, 65 which causes the execution of a search entered into its associated search dialog box 62, 63. The execution of a new search typically causes the contents of the entire multi-paned search results window 15 to be updated to display the new search results.

The page header 60 and page footer 61 may also contain any other information believed to be useful and desirable. For example, in the illustrated embodiment, the page header 60 also includes a string of buttons 67. The first button 67(a) provides a link to the home page of the web site hosting the described search results GUI. The second button 67(b) provides a link to a toolbar that can be used to provide additional functionality. The third button 67(c) allows a user to sign out. The illustrated page header also includes a greeting 69 that welcomes the user and provides a link to a sign-in page in the event that the wrong user has been identified. It should be appreciated that signing in or otherwise recognizing the user is useful in embodiments that track the search history so that the search history accurately reflects the current user's search history.

Referring next to FIGS. 3(a)-3(d) some of the features of search results window 15 will be described in further detail. As pointed out above, the panes 20, 22 and 24 may be individually closed. FIG. 3(a) a illustrates the refreshed contents of the search results window 15 from FIG. 2, after the search history pane 24 has been closed while leaving panes 20 and 22 open. In the illustrated embodiment, the closed pane 24 is represented by a very narrow column with a single vertically oriented "Open Search History" button 70(c). The "Open Search History" button 70(c) may be selected by a user to open or reopen the search history pane. In the illustrated embodiment, the button 70(c) is configured to have the appearance of a link. However, it should be apparent that in other embodiments, the button 70(c) may take other forms or be replaced by other appropriate GUI widgets. When the search history pane 24 is closed, the window 15 displays the same information in panes 20 and 22, although the width of one or both of the panes 20 and 22 is adjusted to be wider so that the width of the entire search results window 15 remains the same. With the resulting wider column width, the screen may then be able to display some additional information, which would typically take the form of the next available search results as illustrated by comparing the contents of panes 20 and 22 in FIG. 2 to the contents of the same panes in FIG. 3(a). In many implementations, the contents of the panes may extend beyond a single screen of the display device that is rendering the page. In such arrangements the additional contents would already be present and could be displayed upon pane resizing. In other embodiments, the contents of the search results windows could be updated each time a column is resized in order to appropriately fill any enlarged pane. In still other embodiments, only the same information would be displayed.

FIG. 3(b) illustrates the refreshed contents of the search results window 15 from FIG. 3(a), after the book results pane 22 has been closed while leaving pane 20 open. In this configuration, both the book results pane 22 and the search history pane 24 are represented by narrow columns with their corresponding vertically oriented "Open" buttons 70(b) and 70(c) respectively.

Figure 3C:
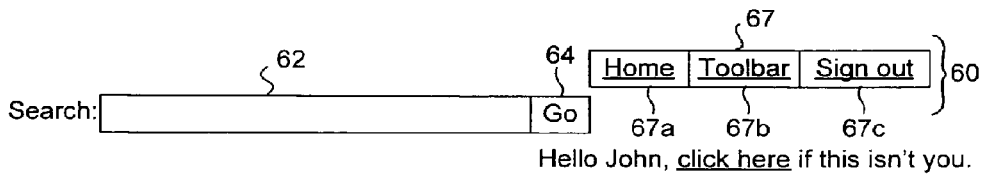
FIG. 3(c) is a screen shot illustrating the representative graphical user interface shown in FIG. 2 with the web results pane closed.

In the initially described embodiment, the panes retain their relative positioning even when one or more of the panes are closed. That is, in the three paned embodiment illustrated in FIGS. 2 and 3, the left most pane 20 always contains the web search results, the middle pane 22 always contains the book search results and the right most pane 24 always contains the search history information. Thus, if the left most pane 20 is closed, it is represented by a narrow column on the left hand side of window 15 with a vertically oriented "Open Web Results" button displayed therein as illustrated in FIG. 3(c). Similarly, if the two left-most panes 20, 22 are closed, the corresponding narrow columns are both displayed to the left of the open pane 24 (this configuration is not shown in the drawings). If panes 20 and 24 are closed while pane 22 remains open, then the corresponding narrowed columns 20 and 24 are respectively positioned to the left and right of the open middle pane 22 as illustrated in FIG. 3(d). This provides a look and feel that is particularly comfortable for users because the relative positioning of the various content remains the same from page view to page view and from session to session.

As briefly mentioned above, the user may readily adjust the relative widths of the columns using the column adjustable column markers 30. By way of example, a simple conventional click and drag operation on the column markers 30 may be used to adjust the width of the column. That is, the width of a particular pane may be adjusted by grabbing (e.g. clicking on) a column marker 30 that marks an associated pane boundary and dragging the column marker to the desired width before releasing the click. It should be appreciated that when the width of one column (e.g. pane 22) is increased by dragging (or otherwise moving) a particular column marker (e.g. column marker 30(b)), the width of the other pane adjacent the column marker (e.g. pane 24) will be reduced by a corresponding amount. Of course, a number of other gestures and/or interfaces may be used to give the user control over the width of the various panes. For example, a button or pull down menu could be provided that when selected causes a dialog box to be presented that permits the user to explicitly designate the relative column widths.

Preferably the system is arranged to dictate the width of the panes in terms of a percentage of the width of the window 15 so that the actual width of the panes will vary in an appropriate way based on the general width of browser window 13. Thus, if the width of the browser window 13 is increased or decreased by the user, the actual widths of the columns 20, 22 and 24 will be proportionally changed accordingly, while their relative widths remain the same. Although the proportional column width approach is generally preferred, it should be appreciated that in alternative embodiments, a wide variety of other pane sizing rules and/or constraints may be used in its place.

In the primary described embodiment, a pane may be closed in multiple ways. As pointed out above, a particular pane may be closed by selecting its associated close button 43. Additionally, the user may close a pane by dragging an associated column marker 30 in a manner that reduces the column width to below a designated threshold width or width percentage. By way of example, width percentages of 10-15% of the total window width have been found to work well as the pane closing threshold. In other embodiments, different thresholds (and particularly narrower thresholds) may be used as well. Typically, when a pane is closed, all of the search results or search information will be removed from the associated pane as illustrated in FIG. 3, although that is not a strict requirement.

The relative width of the narrowed columns associated with a pane closed by selection of an associated "close" button 43 may be widely varied. By way of example, default close column widths on the order of 5-10% of the total width of window 15 work well. In embodiments where the pane closing threshold is set to be wider than the default close column width, the width of columns closed by moving one of the column delimiters 30 may either be left at the close width set by the user or set to the default close column width. Typically, the width of a column cannot be set to below a designated minimum width percentage. Also, the designated minimum width percentage would typically be the same as the default close column width, although this is not a requirement.

When a pane is opened, the other panes that were already open remain open and are resized appropriately within the browser window to make room for the newly opened pane. Conversely, when a pane is closed, the other open panes are resized in order to absorb the extra room within the browser window that was previously occupied by the closed pane. Any of a wide variety of resizing formulas can be used. By way of example, in one implementation, when a closed pane is open when there is only one other pane open, then the currently open pane is resized to 50% of the available width and the new pane is opened using the remaining 50% of the available width. If more than one pane is currently open when a new pane is opened, than the new pane is opened to occupy 40% of the available width and the other currently open panes are narrowed proportionally to together occupy the remaining 60% of the available space. Thus, if two panes are currently open occupying 70% and 30% of the available space respectively, then when a third pane is open, their relative widths would be 42% for the first pane (i.e., 0.7×0.6), 18% for the second pane, and 40% for the newly opened pane. In another implementation, the newly opened pane is given a pro rata percentage of the total available space when it is opened and the other panes are resized proportionally. In this example, if there are three open panes when a closed pane is opened, the newly opened pane is allocated 25% of the available space and the other three panes are resized proportionally to take the remaining 75% of the available space. In still another embodiment, the "newly opened" pane may be set to a size based on observed or set user preferences. Of course, a wide variety of other sizing formulas could be used as well. It should be noted that the "available space" may not always be the same as the total window width because other features (as for example closed panes, tabs, toolbars, etc.) may occupy some of the available window space.

When a pane is closed, the remaining open panes may be resized in accordance with an appropriate resizing formula as well. By way of example, one approach would be to expand all of the remaining open panes proportionally. In this example, if four panes in the open state have relative widths of 30%, 30%, 20% and 20%, and the third pane is closed, than the three remaining panes may be resized to have relative widths of 37.5%, 37.5% and 25%. Again, although a specific resizing formula is described, it should be appreciated that a wide variety of other resizing formulas may be used as well.

In the initially described embodiment, the search results window 15 has three vertically oriented panes. This allows the presentation of three separate columns of search related information. In other embodiments, it may be desirable to present additional sets of information. In some implementations, this can be done by adding one or more additional vertically oriented panes. For example, a fourth pane (and additional panes) could readily be added using substantially the same rules previously described with respect to the embodiment illustrated in FIGS. 2 and 3.

In the embodiment illustrated in FIGS. 2 and 3, a results page navigation bar 76 is provided in a footer region of search results window 15. As will be appreciated by those familiar with searching, it is common for search results to return far more hits than can appropriately be displayed on one page. Therefore, it is common to provide a page results navigation bar at the bottom of a page of search results. In the illustrated embodiment, the page results navigation bar 76 applies primarily to the two search results columns 20 and 22. When the search history column has less than one page of information, the same search history information will be represented in the search history pane 24 when the user navigates to a new page of search results. However, if more than one page of history results is present, the next page of search history information may be provided if available. In other embodiments, the page results navigation bar 76 may always apply to all three panes, or operate under any set of rules and/or constraints considered appropriate for the particular application.

In other embodiments, the page results navigation bar 76 may be replaced or supplemented by separate pane results navigation bars 77 (see FIG. 4) that are provided as appropriate in the associated panes (as for example in the footer region 37 of the appropriate panes). In other embodiments other GUI widgets, as for example search result page or column slider bars 78 (scroll bars) may be provided to give the user control over the results being presented. One such implementation is illustrated in FIG. 6.

Figure 4:
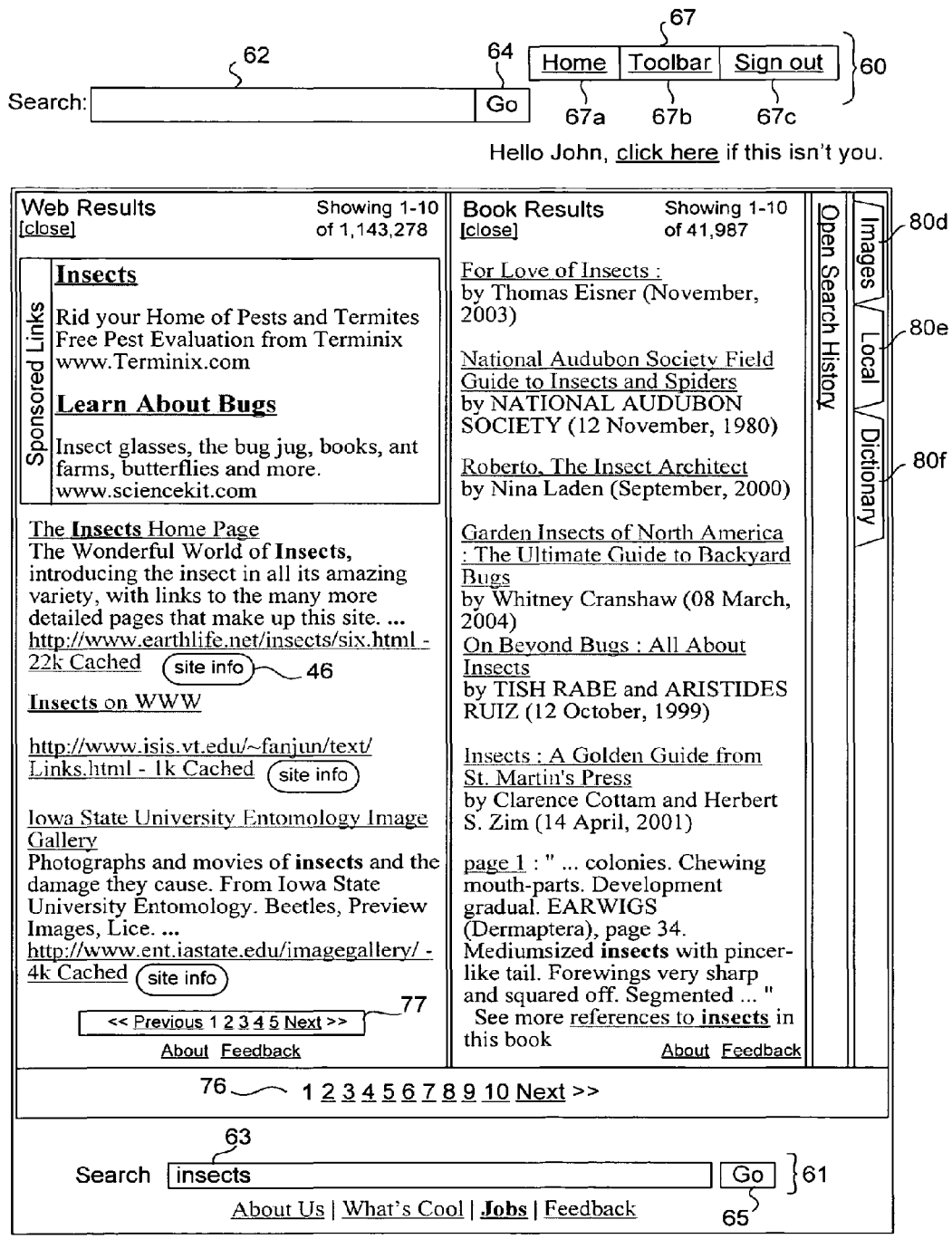
FIG. 4 is a screen shot illustrating a representative graphical user interface in accordance with a second embodiment of the invention.
Figure 7:
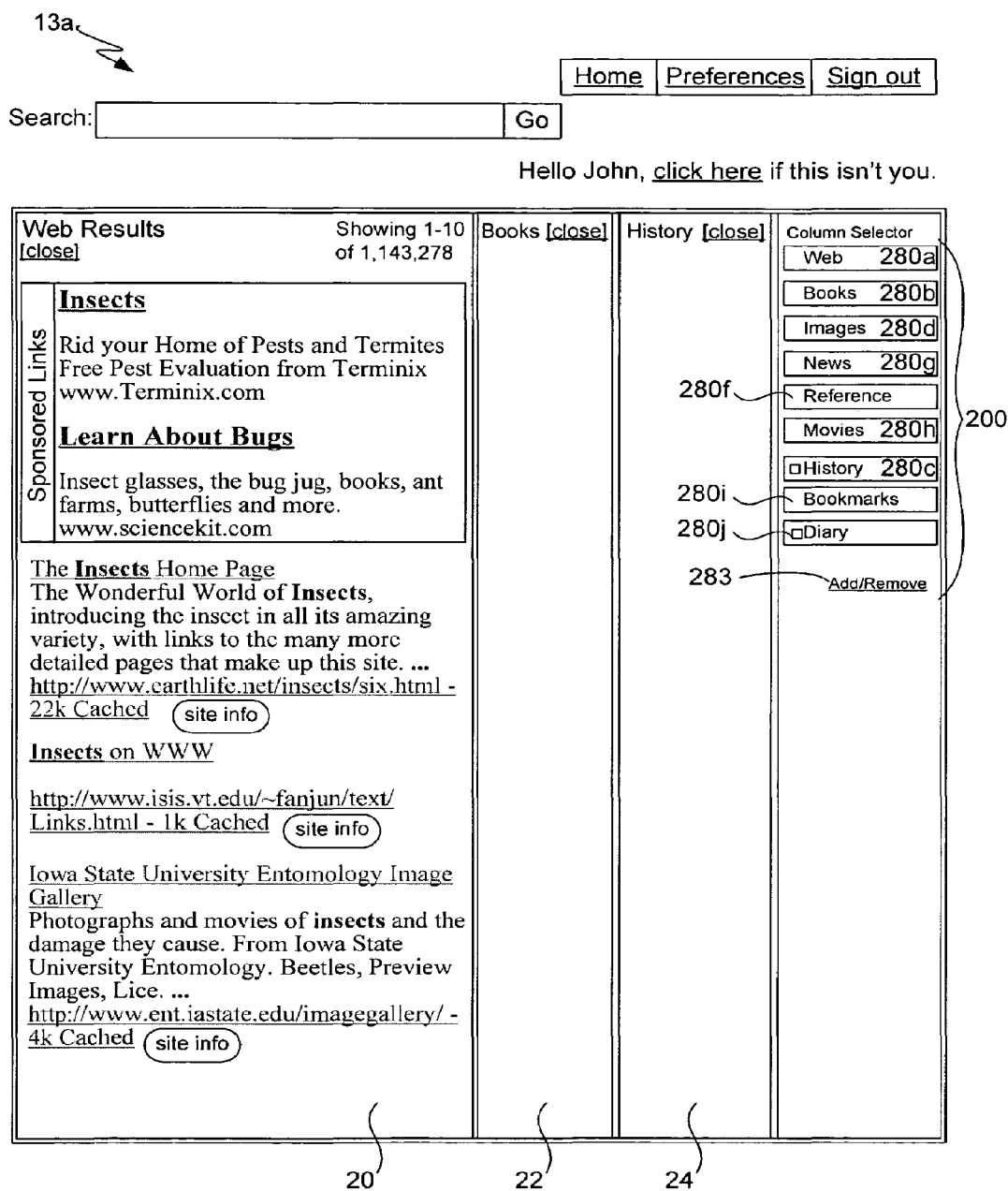
FIG. 7 is a screen shot illustrating a graphical user interface in accordance with a fourth embodiment of the invention.
Figure 8:
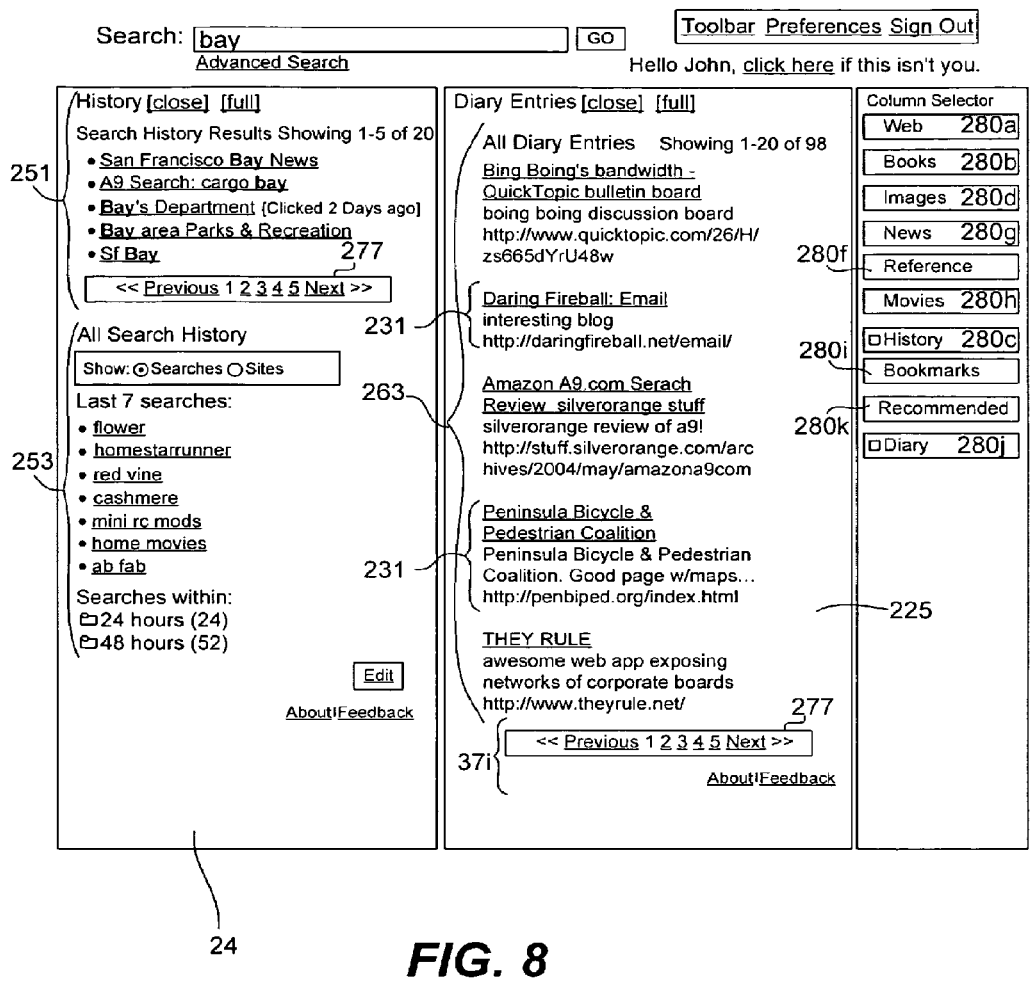
FIG. 8 is a screen shot illustrating the graphical user interface of FIG. 7 with the History and Diary panes open.

Referring next to FIG. 4, another embodiment of the invention will be described. In this embodiment, closed panes are represented as tabs 80 positioned on an edge of the search results window 15. In the illustrated embodiment, the closed pane tabs 80 are positioned along the right side edge of search results window 15. However, it should be appreciated that the tabs could be positioned along any edge of the search results window 15, as for example the top edge, the left side edge or the bottom edge. In other embodiments, the tabs could take the form of buttons or other appropriate GUI widgets located at another location within the browser window 13, as for example within the page header region 60. As will be described in more detail below, FIGS. 7 and 8 illustrate an embodiment where buttons 280 are displayed as part of a column selector 200.

The embodiment illustrated in FIG. 4 can be used in implementations having any number of available search related information panes. For example, in a three pane implementation, the tabs 80 may be used in place of the narrowed closed column markers described above with respect to FIG. 3. The tab marker based approach is particularly useful in implementations that have more than three categories of information that can potentially be displayed. By way of example, FIG. 4 illustrates a graphical user interface that is adapted to present search results and search information organized into six categories of information. These include the web search results, the book search results and the search history previously described. Additionally, the embodiment illustrated in FIG. 4 includes image search information represented by tab 80(*d*), local search information represented by tab 80(*e*) and dictionary search information represented by tab 80(*f*). Of course, the various panes and tabs can be used to represent and/or display a wide variety of other categories on information as well.

By way of example, the image search results may be the results of a general web based image search such as the results of a web base image search provided by the Google (or similar) image search engine or the results of the search of one or more particular image database. The dictionary search information may represent the results of selected dictionaries. In other embodiments, the dictionary results may be presented as part of a reference search information category as illustrated in FIG. 8. The reference search information may represent the results of selected reference materials, such as dictionaries, thesaurus, encyclopedias, etc.

The local search information may represent the results of a search of web sites of entities that are geographically relatively "close" to the user. It should be appreciated that in many types of searches, a user may be particularly interested in obtaining the results from entities that are geographically nearby. For example if a person is searching for a "Japanese restaurant" or "motor home rentals," in many if not most situations, they will be particularly interested in nearby businesses as opposed to businesses located several states away. As long as the search provider knows the location of the user, localized search results can be provided. The geographic location of a user may be determined either explicitly (e.g. by asking or registration) or implicitly (e.g. based on the user's IP address). As will be appreciated by those familiar with the allocation of IP addresses, it is generally possible to at least roughly determine the geographical location of a user based on their IP address. The user location information can be used to accommodate a search in which results are selected or ordered based at least in part upon the geographic proximity of the entities (e.g., are the result entities located generally within the same city, county, region, etc. as the user).

There are, of course, a wide variety of other search results categories that could be useful in particular context sensitive situations. For example, if a search term includes a phrase that looks like an address (e.g., 819 North First Street) and/or a five digit number that looks something like a zip code (e.g., 94402), it may be desirable to provide map type results. If a search term includes a string of digits that match a particular format, (as for example an express mail tracking number, an order number, a phone number, etc.), it may be desirable to provide a category of results that is based on a guess of what the number may refer to. For example, if a search term matches the format of an express mail (or other) tracking number, it may be desirable to provide an express mail tracking results category.

In the discussion above, one of the categories described is a "book results" category, which presents the results of a search of a books related database. It should be appreciated that other similar databases, as for example movie and/or music search categories may be provided as well or in the alternative. In yet other implementations, a combined media category could be provided.

The categories could be topic related as well. For example, one search category could be "medical", another "travel", another "finance", another "news", another "science" and any of a wide variety of other topics that may be considered useful.

Still another category that may be helpful in many situations is a search of "bookmarks". That is, a search of the sites that the user has bookmarked. The bookmark search could be a simple search of contents of sites that the user has bookmarked or even just the bookmarked URLs. Another useful category (referred to herein as a "diary" search) would present the results of a search of content that has been created, stored, referenced or otherwise identified by the user.

It should be appreciated that the identified categories are only a small set of the potential search categories that might be appropriate in a particular situation and that one of the powers of the described interface is that it can be used in presenting results from the searching of a wide variety of different categories.

The described user interface is well adapted for use in systems that are capable of returning context sensitive search results. That is, in systems that will return different categories of search results based in part upon the search terms used. For example, if a system is designed to include all of the previously mentioned search categories, a search on the term "insect" may return results in several (but not all of) the described categories. Using the embodiment illustrated in FIG. 4 as an example, such a search might return results in the "general web search", "book search", "images", "local" and "reference" or "dictionary" search result categories, but not in the "map", "tracking" or other number based search result categories. Thus, in the illustrated embodiment, results are shown in the currently open panes, and the user is informed that additional categories of search results are available by the tabs 101, 103 and 105 that appear at the edge of the search results window 15.

In the previously described implementations, the open panes typically remain the same size and display the same contents when the page is refreshed to present the results of a new or updated search. However, that is not a requirement. The described graphic user interface is quite flexible and the search provider is free to return the results in any manner deemed appropriate for a particular search and the user is free to customize their interface as desired. One suitable approach would be to return the results in any open panes using the same size pane setting, while using closed panes (e.g., the narrowed columns or panes marked by tabs etc.) to indicate other categories of results that might be available. In other situations, it might be preferable to present the results and information believed to be most appropriate in one or more of the open panes while leaving other available results marked by closed panes. For example, when different categories of information are likely to be more relevant than a category currently being displayed, the provider could return results with one or more additional columns (e.g., retaining the previously existing open frames and adding one or more new open columns of results that are deemed to be appropriate for the specific search results). Alternatively, the search provider may choose to replace the contents of one or more of the existing open panes with results or information in a category that is believed to be more suitable. Typically, the relative widths of the open panes would be retained when the contents are updated or refreshed. However, if deemed appropriate for a particular application, a search provider could change the relative widths of the various open panes as well.

In the described embodiment, the system is arranged to remember which panes are open and which panes are closed as well as the relative sizes of the open panes. As described above, this may be done by remembering the relative widths of the various panes, as for example, by storing the percentage width of each column. It should be appreciated that the open/closed information may be stored either explicitly, or implicitly. For example the open/closed state information may be implicitly stored by designating a column width of zero or some other specific number. This pane state and size information can be maintained in a cookie stored on the client system, on the server or both. Anytime the user adjusts the pane state (e.g., by opening or closing a pane or by resizing a pane), the appropriate state information can be updated accordingly both locally and remotely as appropriate. If the system knows the user or the user's machine, the pane state and size information can be carried over from session to session. This is often beneficial to the user because it permits the user preferences to be retained from session to session. A cookie can be used to maintain the same setting on the same machine. However, there are also several advantages to storing specific user preference information on the server side as well. This permits the same user to maintain the same preferences regardless of the machine used and it provides an easy mechanism for different users using the same machine to maintain individual preferences.

Maintaining the pane settings can facilitate several potential performance enhancements as well. If a particular pane is closed, the server may choose not to perform the associated search and/or not supply the results to the browser unless or until the pane is opened. Not performing unnecessary searches can lessen the load on the server side. Similarly, not supplying unnecessary search results may speed the delivery of the results to the user, particularly when the user has a low bandwidth connection and/or the search results are particularly large (as may be the case if the search results themselves include images). In other embodiments, the searches in categories in closed panes may be assigned a lower priority or otherwise delayed based on the server load. This may be useful for server load balancing while still generating the search results so that they may be available at a later time. In some implementations, it may be desirable to return the results associated with closed panes in the background. For example, the results returned to closed panes may be delayed until after all of the open pane results have been delivered to improve the performance apparent to the user. It should be appreciated that the knowledge of the state of the various panes can be used by the server to facilitate any of the described performance enhancements either alone or in various combinations.

As will be appreciated by those familiar with web and website based searching, search engines in general are becoming more powerful and capable of returning results in more varied and more different specific categories of information. The described graphical user interface is particularly well suited for use in some of these more powerful search systems and systems that are capable of returning context sensitive results that may be more pertinent to the user.

For example consider a situation where the user enters a search for "pictures of Arizona." Based on the search phrase, the system might deduce that the user could be specifically looking for images of Arizona. With this knowledge, one of the available panes can be used to return results of a web based image search. At the same time, it might be deemed appropriate to return results of the general web based search, a book search, and if a search history is provided, an updated search history. The next search may be for a specific number, as for example 90210 either standing alone or in combination with a couple other specific search terms. The specific number entered appears has the format of a United States zip code and thus, the system might deduce that the user might be looking for geographical information (e.g., information about where zip code 90210 might be located), or for information about a business or other entity within that zip code. Therefore, in addition to a general web search, the system might decide to return map based results, and/or results that are local to the associated zip code. In this particular situation, the number entered is also part of the title of a once popular television series. Therefore, a search on that number may well turn up search results in a number of other categories as well.

Depending upon the search rules utilized by the specific search engine, the search system could do a wide variety of different things when a search request is received. For example, it could perform searches in all available categories, it could perform searches in specific categories that are suspected to be appropriate based on the search terms used (e.g., context sensitive searching), it could perform searches only in categories that are marked by open panes, etc. After performing the desired searches, the system may return results in all categories that contain a result, it could return results only to the open panes while marking other categories that contain results with closed pane identifiers (e.g. tabs 80), it could return the results believed to be most appropriate into some the open panes while marking other categories having available results with closed pane identifiers, or it could use any other suitable set of rules. Regardless of the searching and search presentation rule used by a particular system, the described GUI provides an excellent interface for rendering the desired results.

Referring next to FIG. 7, another embodiment will be described. In this embodiment, the panes and the surrounding features (e.g., search dialog box 62, etc.) may be generally configured the same manner as in the previously described embodiment. However, a column selector 200 is also provided that in the illustrated embodiment, is displayed along the right hand side of the search results window adjacent the open panes. Of course, in other embodiments, the location of the column selector 200 may be varied, and it may be placed, for example, in the header or footer portion of search results page 13(*a*), along the left side of the page or at any other suitable location. In the state illustrated in FIG. 7, the search results page 13(*a*) has three open columns 20, 22 and 24, which correspond to the web results, book results and search history categories previously described. The illustrated column selector 200 has a set of nine vertically separated buttons 280 that correspond to the available categories. In the illustrated embodiment, the buttons (which correspond to the available categories) include web results button 280(*a*), book results button 280(*b*), images results button 280(*d*), news button 280(*g*), reference button 280(*f*), movie button 280(*h*), history button 280(*c*), bookmark button 280(*i*) and diary button 280(*j*). In the state illustrated in FIG. 8, a tenth button 280(*k*) is illustrated that corresponds to a recommended category.

The illustrated column selector 200 also includes an add/remove link 283 that links to a column selector preferences dialog box (not shown) that permits users to configure their column selector 200. The preferences button 67(*d*) may also be used to provide users access to either the same or a different preferences dialog interface. By way of example, the user may be given control over the buttons that are presented, the display location of the column selector, display colors, pane sizing and configuration constraints, the maximum number of open panes, pane resizing rules in response to the opening and closing of new panes, etc.

A closed pane may be opened by selecting its associated button 280 in the column selector 200 and optionally, an open pane can be closed by selecting the same button. In the illustrated embodiment, the column selector is provided in addition to any close or open buttons/links 43, 70 etc. that may be provided in a displayed column as described in the previous embodiments. As discussed above, when a closed pane is opened, the other open panes are typically resized, but remain open. It should be appreciated that if too many panes are open at a particular time, then some of the columns will become too narrow to be able to present useful information. Therefore, the system may be arranged so that when a new pane is opened and there are too many open columns, then one or more of the existing open columns may be automatically closed. There are a wide variety of rules that could be applied to dictate when a pane should be automatically closed without user input and what particular pane to close. Preferably, the user would be given at least some control over the rules applied by accessing the preferences dialog box.

By way of example, one automatic closing rule could be to provide a designated maximum number of panes (e.g. 5 columns) that may be open at one time. Using this approach, there also has to be a rule designating which of the currently open columns to close when a new pane is opened. One suitable rule would be to close the pane that had not been clicked in or otherwise browsed for the longest period of time. Another suitable rule would be to close the smallest open pane.

A different automatic closing rule would be to close each pane that falls below a designated minimum display width. By way of example, threshold widths on the order of 10-20 percent of the available columns display space width may work well for this approach. In this approach, when a new pane is opened, the existing panes may be resized as described above. However if any of the panes would be reduced in width below the designated minimum display width, those panes would be closed and the others resized appropriately. Alternatively, one of the narrowest of the panes could be closed and the other sizes recalculated. If any of the remaining panes are still narrower than the designated minimum display width, the then narrowest pane would also be closed and the remaining panes resized in accordance with the appropriate resizing rules. Of course, a wide variety of other resizing rules could be used as well.

Referring next to FIG. 8, several additional features of some of the illustrated categories will be described. In the embodiments shown in FIGS. 2, 5 and 6, the search history pane 24 primarily displays hierarchical lists of the searches previously performed. However, the search engine can be configured to search the search history as well. In the embodiment illustrated in FIG. 8, the search history pane 24 has a history search results section 251 and a search history section 253. The search history section 253 presents the hierarchical lists of searches previously performed as described above. The history search results section 251 present the results of a search of the search history using the designated search term.

Using an example wherein the search term is "bay," a search of the search history would be configured to search the results of all the searches identified in the search history to identify search results entries that include the term "bay." The search may be arranged to search the entire text of the search entries, the search terms alone or any other desired part or parts of the search history. In order to perform this type of a search, the server would preferably store the results of all of the searches referenced in the search history. By way of example, a suitable system for tracking search history is described in co-pending application Ser. No. 10/612,395, entitled: Server Architecture and Methods for Persistently Storing and Serving Event Data, which is incorporated herein by reference. When these results are stored, a search engine can readily search the stored results for the search terms and the corresponding hits are presented in the history search results section 251. This type of search results can be particularly useful in situations where the user recalls that they have browsed through the results of a search to a particular location of interest, but they don't recall the particular website. In many situations, it might be easier to look at search results from a search of the search history, than to try to recreate the search and browse the corresponding results to relocate the site. It should be apparent that this ability to search one's "search history" can be a powerful tool for locating previous hits. In many situations, as for example when conducting a complicated search, a user may browse a large number of search results entries. At a later time, (which could be days, weeks or months later), the user may wish to go back to a site that they previously visited during one of the searches, but recreating a general search that can quickly point to the desired link may be difficult. However, using an appropriate keyword in a search of previous search terms or search results may provide a much more efficient mechanism for quickly finding the desired previous hit.

The Diary pane 225 also has several interesting features. One of the panes 225 can be designated as a "whiteboard" or "diary" pane, which is arranged to permit users to place their own content in the pane. A wide variety of rules may be used within the whiteboard. For example, a user may be able to place search results entries 231 of interest in the whiteboard portion of pane 225. This may be done by selecting an entry from any of the other open panes and moving it into the whiteboard. This is particularly useful in situations where a user is conducting an extensive search and finds something perceived as particularly interesting, relevant or useful. Having the diary available allows the user to place that search result entry into a separate location where it can be more easily found. A wide variety of gestures may be used to move a particular entry into the whiteboard. By way of example, dragging and dropping, cutting and pasting, copying and pasting, etc. are all suitable gestures for moving an entry into the diary.

The whiteboard can optionally be arranged to permit a user to create folders or other containers that can be used to group diary entries. It can also be arranged to permit users to store other items therein, such as bookmarks, files, web pages, documents etc. In one embodiment, the user can also type comments into the diary. The comments can, for example, be used to annotate specific diary entries, such that the user easily can recall why a particular entry was put in the diary, even after a long time passes.

Another interesting optional feature that may be added to the whiteboard (or optionally any of the other panes) is the ability to perform a further search in a particular category by performing the gesture of moving an entry from the whiteboard into one of the other searching panes. Specifically, in this implementation, when an entry is "moved" from the whiteboard (diary) pane 280*j* into another column (e.g., by dragging and dropping the entry into image pane 280*d*), a search is conducted in the target pane (i.e., an image search in this example) using the subject of the search entry as the search terms. For example, if the search entry in the diary is about a particular camera, as for example, the Canon Powershot, and that entry is moved from the diary pane 280*j* to the image pane 280*d*, an image search is performed for Canon Powershot and the screen is refreshed to display the returned search results, which would presumably include images of the Canon Powershot.

In the illustrated embodiment, the Diary pane 225 has a whiteboard section 263. In other embodiments it may also include a diary search results section (not shown). The whiteboard section 263 presents the various search entries and/or other items that the user has placed within the whiteboard. The diary search results section (if present) would present the results of a search of the whiteboard section 263 using the designated search term. It should be appreciated that like the search of the search history, a search of the diary can at times be an extremely powerful tool for helping a user quickly find a previously found result. If a user perceives a hit to be of particular interest, they may place the corresponding search results entry in the whiteboard where it is readily accessible. If the whiteboard has only a few entries, then all of the contents of the whiteboard might be readily accessible any time the diary pane 225 is open. However, in situations where the user actively uses the whiteboard to store a large number of items, a search of the entries in the diary can be a very useful searching tool. The diary search results section is arranged to present the results of a search of the contents of the whiteboard using the designated search term (i.e., "bay" in the search results illustrated in FIG. 8).

In some embodiments, multiple instances or versions of a diary can be saved. For example, a user may recall that about two months ago he put a particularly interesting entry into the diary, but since then he might have added hundreds or thousands of new entries into the diary. The user can then select an option to view what the diary looked like two months ago, and will thereby have an easier time to find the desired entry, compared to having to browse through the subsequently added entries as well. Another useful scenario for multiple diaries is where a user has created diaries based on specific topics, for example, a user may have one diary containing entries relating to his latest vacation trip, and another diary containing entries relating to his favorite hobbies, and so on. The diaries can either be saved completely manually by the user, or be saved automatically on a regular basis, such as every session/day/week/month, and so on, depending on the configuration settings for the diaries.

Any time a pane displays multiple independent sections, it may be desirable to provide a mechanism so that the sections can be independently navigated. For example, it may be desirable to permit independent navigation of the diary search results section 261 and the whiteboard section 263 of diary pane 225. Similarly, it may be desirable to permit independent navigation of the history search results section 251 and the search history section 253 of search history pane 24. In another example, it may be desirable to permit independent navigation of a sponsored links section of any of the panes from the pure results. This can readily be accomplished by providing appropriate GUI navigation widgets within the pane. For example, in the state illustrated in FIG. 8, section navigation bars 277 are provided at the end of the sections that have excess results so that a user may readily navigate those sections independently. Of course, other appropriate navigation widgets such as slider bars, etc. could be used as well.

Another category illustrated in FIG. 8 is a bookmark category that contains a set of bookmarks. The bookmarks can be either the bookmarks stored in the user's browser, or bookmarks that have been separately identified to the server using an appropriate bookmarking technique. Like the search history pane 24 and the diary pane 225, the bookmark pane may be divided into separate sections including a bookmark search results section that presents the results of a search of the bookmarks, and a bookmark section that simply presents a list of the bookmarks. In some implementations, a web site may be bookmarked by adding its associated search results entry into the bookmark section of the bookmark pane. This may be done by marking an entry as a bookmark, moving an entry into the bookmark section, etc. In this regard, it has some similarities with the diary pane, however the bookmark pane is generally arranged to save bookmarks (i.e., a short page title with a URL) as opposed to the potentially larger search result entries. Again, it should be appreciated that the ability to search bookmarks can be a useful tool for those who are active users of bookmarks.

Another category illustrated in FIG. 8 is a "Recommended" category that is marked by button 280(*k*). The recommended pane presents results that are "recommended" as being potentially useful to the user. The recommendations can be based on the search terms presented and/or on matters that are unrelated to the current search. The heuristics used to compile the recommended list can be widely varied and a wide variety of approaches can be used to create the recommendations. By way of example, in one embodiment, the search server may be arranged to store the search terms used in each search. The server can then track the results that the user(s) actually links to. The next time a user (which may be the same user or a different user) enters the same search terms, the links that were previously actually followed may be presented as the recommended list. As the number of users that utilize the same search terms increases, the "recommended" list might be trimmed to include only items that were selected a designated percentage of the time. Other parameters such as monitoring the amount of time a user remains at a particular site or the activity of the user within the site may be used for attaining or ranking recommended results.

The described graphical user interfaces provide a framework that allows a user to easily and intuitively review the results of searches in any of a wide variety of categories. The layout of different panes as side-by-side columns also readily facilitates a number of enhancements. For example, the side-by-side column layout makes it easy to implement various mechanisms (e.g., drag and drop, cut and paste, etc.) for moving items between columns or adding items to columns. Thus, in many implementations the user is given the ability to move search results entries from one pane to the next. This is most often useful in situations such as the diary or bookmark pane examples where an item from one column is added to another. However, this feature can be used in any panes so that items from one set of search results can be added to any other as desired.

The layout also facilitates a number of enhancements where activity in one pane influences the results of other panes. For example, if a link from a search results entry is followed in one pane, it may be highlighted within that pane as well as in other displayed panes. Alternatively, in order to reduce the number of hits, the server providing the search results could filter hits that are duplicated in different columns or to affect the ordering of the search entries based on whether a particular hit shows up in multiple columns. For example, an entry that shows up in more of the different panes or in certain panes (e.g., the diary or bookmark sections) may be assigned a higher relevance in the search results than it might otherwise have had. In yet another example of inter-pane influences, if the search results in one pane are refined, then the results displayed in other panes may be automatically refined as well.

In some implementations it will be desirable to have buttons, tabs, or other appropriate GUI widgets that correspond to each of the available search and information categories. In other implementations, it might be desirable to only display the categories for which search results or other information are presently available. In still other implementations, it might be desirable to have several base categories that are always represented and others that are represented only if they have information or results available. By way of example, the column selector 200 illustrated in FIG. 8 has buttons corresponding to all of the categories illustrated in FIG. 7 plus an additional button 280k, which corresponds to "recommended" items. This is because in the particular search illustrated in FIG. 7 there were no recommended items, whereas in the particular search illustrated in FIG. 8, there were recommended items.

Figure 9:
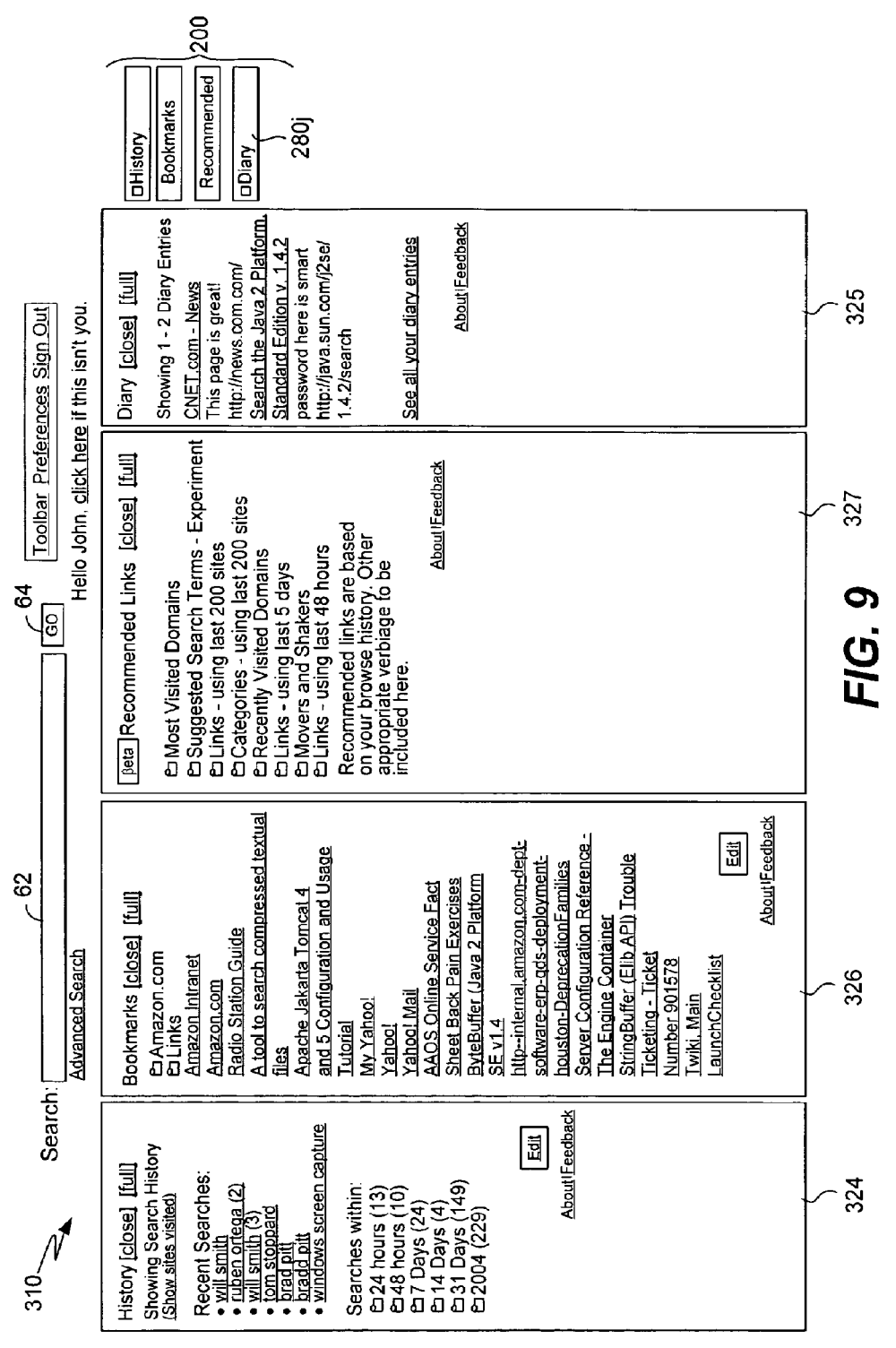

Referring next to FIG. 9, an alternative embodiment of an initial search entry page that utilizes a multi-paned display window as an initial input page will be described. In the illustrated state, the initial page 310 has multiple adjustable panes arranged as side-by-side columns 324-327 that display different types of information that may be useful to a user. The panes are adjustable and have open and closed states and can be opened or closed using either buttons within the panes or a column selector 200 in the same manner as the previously discussed embodiment. The interface 310 also has a search dialog box 62 that permits user to enter desired search terms for a new search and a "go" button 64 that causes the desired search request to be submitted to the search engine server.

In the illustrated state, just four panes are available and all are in the open state. Thus the column selector 200 has just those four buttons. The available panes include the search history pane 324, the diary pane 325, the bookmarks pane 326, and a recommended links pane 327. The search history, diary and bookmark panes have the same content as described above with respect to FIGS. 7 and 8, although since no search has been conducted, they do not have any search results sections. In the illustrated embodiment, the bookmark pane appears as a column of folders and bookmark links. The selection of a particular folder (in the bookmark pane or any of the other illustrated panes) would then cause the contents of the selected folder to be displayed within the pane.

The recommended links pane 327 provides links (which in the illustrated embodiment are organized in folders) that might be of interest to the user. The nature of some of these recommended links are described in U.S. Pat. No. 6,691,163, entitled "Use of Web Usage Trail Data to Identify Related Links," which is incorporated herein by reference in its entirety.

When the user submits a search request (as for example by typing a search request into dialog box 62 and clicking on "go" button 64), the search results may be returned using an interface as described above with respect to FIGS. 7 and 8.

Although only a few embodiments of the invention have been described in detail, it should be appreciated that the invention may be implemented in many other specific forms without departing from the spirit or scope of the invention. For example, in the illustrated embodiments, the closed panes are represented by narrowed columns or by tabs located on an edge of the search results window 15. However, it should be appreciated that in alternative embodiments, a wide variety of other GUI widgets such as buttons, link lists or other mechanisms may be used to represent closed columns. Similarly, other components, such as the close buttons 43 have been represented by particular GUI widgets, of course, a wide variety of other GUI widgets could be used to represent the described functionality.

In the described embodiments, the number of open panes is typically limited to a maximum of three to five open panes. This is often preferable because if too many panes are open at one time, their absolute sizes become so small on most display devices that it becomes difficult to present useful results in a visually appealing manner. However it should be appreciated that in some specific applications, it may be desirable to permit the user to open more panes simultaneously.

In the described embodiments the various panes are arranged as parallel adjacent columns. This column-based approach has been found to be an intuitive and visually appealing way to present search results from different search categories. However, in alternative embodiments, the geometry and arrangement of the various panes may be adjusted to meet the needs of a particular situation. For example, in some situations it might be desirable to arrange the panes in horizontal rows. In other situations it might be desirable to split a particular column into two or more vertically separated panes. In specific applications, other pane layouts could be used as well.

In the various illustrated embodiments specific search categories have been described. Although these specific search categories are useful for particular applications, it should be apparent that the described graphical user interface is not in any way limited to such uses. Rather, the search results GUI is well adapted for presenting a wide variety of search results in virtually any combination of search categories and search related information. The searches may be general web type searches, searches of proprietary databases, searches of a single website or searches of a wide variety of other content either alone or in any desired combination. The search results categories can be independent of each other, they may be interrelated sets or subsets or any other combination.

It should be apparent that there is no need for the described search results GUI to be "open" or rendered before a search is performed. Thus, it should be appreciated that the user may enter a search request using any conventional search dialog box or other appropriate search entry mechanism. By way of example, FIG. 1 illustrates one suitable interface for entering an initial search request. Of course, search requests may be entered using search dialog boxes such as those illustrated in FIGS. 2 and 3 or any other suitable mechanism.

In many implementations, the specific search categories presented will be dictated by the search provider. However, it should be appreciated that the described interface is also well suited for use in implementations where the user is given control of the various categories and subcategories of information being searched and/or displayed. Therefore, the present embodiments are to be considered as illustrative and not restrictive and the invention is not to be limited to the details given herein, but may be modified within the scope of the appended claims.

What is claimed is:

1. A computer-implemented method of providing a graphical user interface for electronically displaying search results and related information, the method comprising:

under the control of one or more computer systems configured with executable instructions, providing for electronic display a graphical user interface window comprising at least a first region and a second region, the first region being arranged to display of search results responsive to execution of a search query, and the second region including a whiteboard;

detecting, in connection with one or more selected search results displayed in the first region that represent one or more information resources, user input for a drag and drop operation between the first region and the second region;

when the drag and drop operation is from the first region to the second region and responsive to detection of the drag and drop operation, updating for display at least the whiteboard of the second region to include information representing the one or more information resources represented by the one or more selected search results; and when the drag and drop operation is from the second region to the first region and responsive to detection of the drag and drop operation, updating at least the first region with search results associated with content of the second region corresponding with the drag and drop operation.

2. The computer-implemented method of claim 1, wherein the user interface window further comprises a third region and wherein the method further comprises updating for display the third region to include search results of a search query that is based at least in part on content of the second region.

3. The computer-implemented method of claim 1, further comprising storing a document that archives contents of the second region.

4. The computer-implemented method of claim 3, wherein storing the document includes storing a plurality of versions of the document, each version corresponding to a different time.

5. The computer-implemented method of claim 1, further comprising grouping contents of the second region.

6. The computer-implemented method of claim 1, further comprising, responsive to user input, annotating contents of the second region.

7. The computer-implemented method of claim 1, further comprising, responsive to user input, updating for display at least the second region to include information additional to the information corresponding to the selected one or more search results.

8. A non-transitory computer-readable storage medium, having stored thereon instructions that cause a computer system to provide a graphical user interface, the instructions comprising:

instructions that cause the computer system to provide for electronic display a presentation surface of an application, the presentation window comprising at least a first region and a second region, the first region being arranged for display of search results responsive to execution of a search query, and the second region including a whiteboard;

instructions that cause the computer system to detect, in connection with one or more selected search results displayed in the first region that represent one or more information resources, user input for a drag and drop operation between the first region and the second region;

instructions that cause the computer system to, when the drag and drop operation is from the first region to the second region and responsive to detection of the drag and drop operation, update for display at least the whiteboard of the second region to include information representing the one or more information resources represented by the corresponding one or more selected search results; and instructions that cause the computer system to, when the drag and drop operation is from the second region to the first region and responsive to detection of the drag and drop operation, update at least the first region with search results associated with content of the second region corresponding with the drag and drop operation.

9. The non-transitory computer-readable storage medium of claim 8, wherein the presentation surface comprises a third region and wherein the instructions further include instructions that cause the computer system to update for display the third region to include search results of a search query that is based at least in part on content of the second region.

10. The non-transitory computer-readable storage medium of claim 8, wherein the instructions further include instructions that cause the computer system to store a document that archives contents of the second region.

11. The non-transitory computer-readable storage medium of claim 10, wherein the instructions that cause the computer system to store the document includes instructions that cause the computer system to store a plurality of versions of the document, each version corresponding to a different time.

12. The non-transitory computer-readable storage medium of claim 8, further comprising instructions that cause the computer system to group contents of the second region.

13. The non-transitory computer-readable storage medium of claim 8, further comprising instructions that cause the computer system to annotate contents of the second region.

14. The non-transitory computer-readable storage medium of claim 8, further comprising instructions that cause the computer system to, responsive to user input, update for display at least the second region to include information additional to the information corresponding to the selected one or more search results.

15. A system for providing a graphical user interface, comprising:

a processor; and memory storing instructions that, when executed by the processor, cause the system to:

provide for electronic display a presentation surface of an application, the presentation surface comprising at least a first region and a second region, the first region being arranged for display of search results responsive to execution of a search query, and the second region including a whiteboard;

detect, in connection with one or more selected search results displayed in the first region that represent one or more information resources, user input for a drag and drop operation between the first region and the second region;

when the drag and drop operation is from the first region to the second region and responsive to detection of the drag and drop operation, updating for display at least the whiteboard of the second region to include information representing the one or more information resources represented by the one or more selected search results; and when the drag and drop operation is from the second region to the first region and responsive to detection of the drag and drop operation, updating at least the first region with search results associated with content of the second region corresponding with the drag and drop operation.

16. The system of claim 15, wherein the presentation surface further comprises a third region and wherein the memory further stores instructions that, when executed by the processor, cause the system to update for display the third region to include search results of a search query that is based at least in part on content of the second region.

17. The system of claim 15, wherein the memory further stores instructions that, when executed by the processor, cause the system to store a document that archives contents of the second region.

18. The system of claim 15, wherein the memory further stores instructions that, when executed by the processor, cause the system to group contents of the second region.

19. The system of claim 15, wherein the memory further stores instructions that, when executed by the processor, cause the system to annotate contents of the second region.

20. A computer-implemented method of providing a graphical user interface for electronically displaying search results and related information, the method comprising:

under the control of one or more computer systems configured with executable instructions, providing for electronic display a presentation surface of an application, the presentation surface comprising at least a first region and a second region, the first region being arranged for display of search results and the second region including a whiteboard;

updating for display at least the second region to include information corresponding to one or more first search results of the first region;

detecting, in connection with one or more second search results displayed in the first region, a drag and drop operation, between the first region and the second region, for adding information corresponding to the one or more second search results; and responsive to detection of the drag and drop operation, when the drag and drop operation is from the first region to the second region, updating for display at least the whiteboard of the second region to include the information corresponding to the one or more second search results simultaneously with the information corresponding to the one or more first search results of the first region, wherein the information corresponding to the one or more first search results and the information corresponding to the one or more second search results collectively represent two or more information resources represented by corresponding search result of the first region; and when the drag and drop operation is from the second region to the first region, updating at least the first region with search results associated with content of the second region corresponding with the drag and drop operation.

21. The computer-implemented method of claim 20, wherein the presentation surface is a graphical user interface window.

22. The computer-implemented method of claim 20, wherein the user input corresponds to a drag and drop operation.

23. The computer-implemented method of claim 20, wherein the presentation surface further comprises a third region and wherein the method further comprises updating for display the third region to include search results of a search query that is based at least in part on content of the second region.

24. The computer-implemented method of claim 20, further comprising, responsive to user input for annotation, annotating contents of the second region.

25. The computer-implemented method of claim 1, wherein the information resource is a web page.

26. A computer-implemented method of providing a graphical user interface for electronically displaying search results and related information, the method comprising:

under the control of one or more computer systems configured with executable instructions, providing for electronic display a graphical user interface window comprising at least a first region, a second region, and a third region, the first region being arranged for display of search results responsive to execution of a search query;

detecting, in connection with one or more selected search results displayed in the first region that represent one or more information resources, user input for a drag and drop operation between the first region and the second region;

when the drag and drop operation is from the first region to the second region and responsive to detection of the drag and drop operation, updating for display at least the second region to include information representing the one or more information resources represented by the one or more selected search results;

when the drag and drop operation is from the second region to the first region and responsive to detection of the drag and drop operation, updating at least the first region with search results associated with content of the second region corresponding with the drag and drop operation; and updating for display the third region to include search results of a search query that is based at least in part on content of the second region.

* * * * *